United States Patent [19]

Wollan et al.

[11] Patent Number: 4,896,128
[45] Date of Patent: Jan. 23, 1990

[54] SUPPORT STRUCTURE FOR HIGH FIELD MAGNET COILS

[75] Inventors: John J. Wollan; Raghavan Jayakumar, both of Florence, S.C.; Vincent Abruzzo, Utica, N.Y.; James Lee, Jr., Lake City, S.C.

[73] Assignee: General Electric Company, Milwaukee, Wis.

[21] Appl. No.: 278,124

[22] Filed: Nov. 30, 1988

[51] Int. Cl.$^4$ .............................................. H01F 5/00
[52] U.S. Cl. ..................................... 335/299; 324/318
[58] Field of Search ................ 335/216, 299; 324/318, 324/319, 320

[56] References Cited

U.S. PATENT DOCUMENTS

| | | | |
|---|---|---|---|
| 4,467,303 | 8/1984 | Laskaris | 335/216 |
| 4,560,933 | 12/1985 | Forster et al. | 324/319 |
| 4,571,568 | 2/1986 | Grangereau | 335/299 |
| 4,591,790 | 5/1986 | Takahashi | 324/318 |
| 4,595,899 | 6/1986 | Smith et al. | 335/299 |
| 4,758,812 | 7/1988 | Forster et al. | 335/301 |

FOREIGN PATENT DOCUMENTS 3036503 2/1988 Japan ..................................... 335/216

*Primary Examiner*—George Harris
*Attorney, Agent, or Firm*—Quarles & Brady

[57] ABSTRACT

A support structure for a superconducting solenoid magnet has a set of five symmetrically and coaxially arranged nonferrous support rings. The central support ring mounts two magnet coils and the other four rings each mount one magnet coil so as to restrain the magnet coils from collapsing toward the center along the magnet bore axis and also to resist radially and circumferentially acting hoop stresses to which the coils are subjected. Tubular struts are symmetrically arranged about the magnet bore axis between adjacent support rings and are seated at their ends in counterbores in the support rings to separate and space apart the support rings. Threaded rods extend through the tubular struts and adjacent support rings to fasten the adjacent rings together.

16 Claims, 4 Drawing Sheets

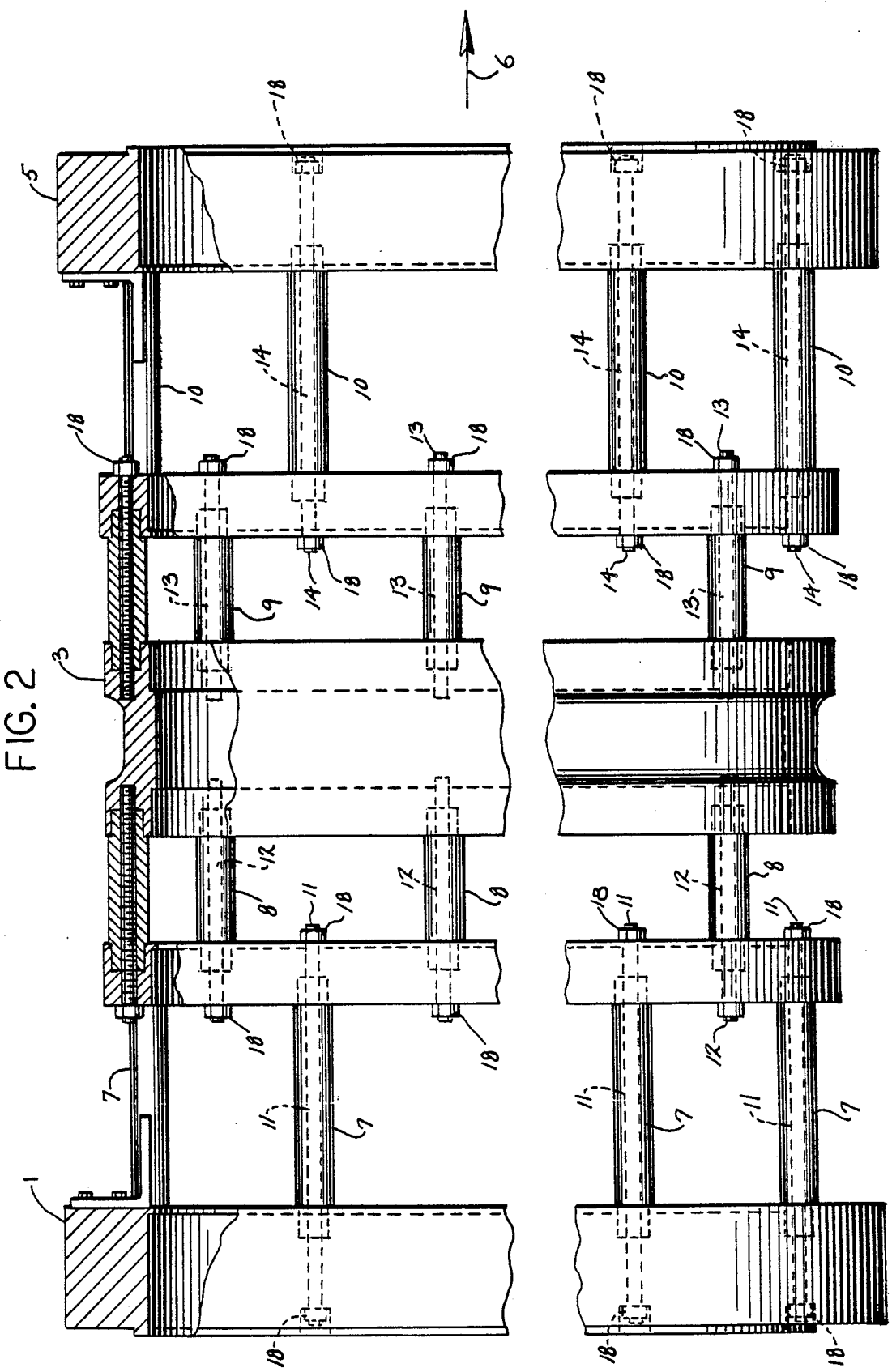

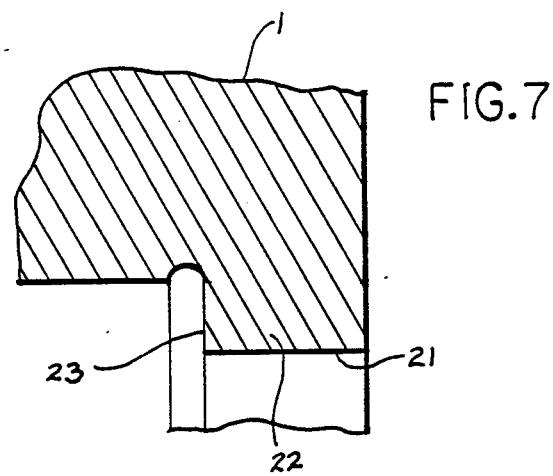
FIG. 7
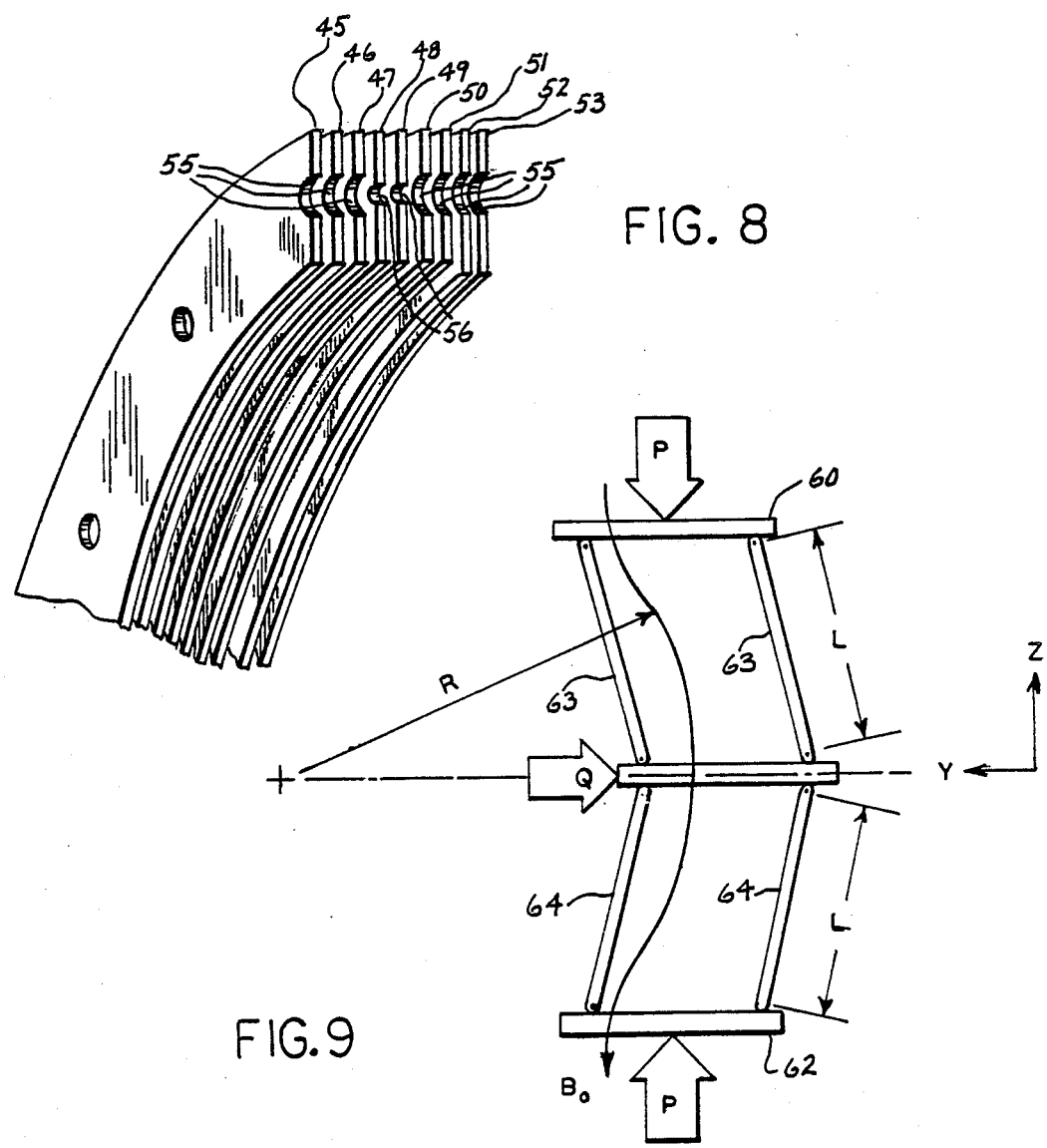
FIG. 8
FIG. 9

SUPPORT STRUCTURE FOR HIGH FIELD MAGNET COILS

BACKGROUND OF THE INVENTION

The field of the invention is support structures for supporting electromagnetic coils which are subjected to high axial and radial forces.

The use of high field magnets, in applications such as magnetic resonance imaging in medical diagnosis, is well known. Such high field magnets are typically made with several discrete electromagnetic coils which are held coaxially with respect to each other by a common frame. The coils are typically superconducting, that is, they are immersed in a cryostat which contains liquid helium to cool the magnet coils to approximately 4.2° Kelvin. At that temperature, the coils have zero resistance and are capable of conducting a very high current density and producing magnetic field strengths of 1.5 Tesla or more. At such field strengths, considerable stress is placed on the magnet coil support structure. Adjacent coils have mutual axial attractive forces of 100,000 to 200,000 lbs. Self repulsion within a coil produces radial or "hoop stresses" of 200,000–500,000 lbs.

The magnet support structure must resist these magnetic field related stresses, and provide the rigidity necessary to ensure that the magnetic field remains uniform over time. This latter requirement was thought most recently to require that the magnet support structure be relatively massive and inflexible.

Prior support structure designs have been of a solid walled. barrel shape. Such structures have been difficult and expensive to manufacture because of the size and weight of the structures which have been used to make up the barrel and because of the difficulty of machining such large elements. Also, the weight of such designs increased the cost of ancillary magnet support structure and limited the use of such magnets to areas where the floor would support high loads. The closed construction of such designs also made assembly more difficult and obstructed the placement of components inside the cryostat.

Moreover, the rigidity of such magnet support structures may have contributed to slippage of the magnet coils relative to the support structure when the axial force to which the coils were subjected changed, for example, when the magnet was energized, or when there were minor misalignments between the coils.

Also, the construction of the barrel shaped support structure resulted in a high mutual inductance between the coils and the support structure by providing a path for eddy currents around the support structure's circumference and along its length. With such a high mutual inductance, changes in the position of the coil with respect to the support structure may have resulted in surges in the coil current. Such surges can trigger a "quench" of the superconducting magnet in which the magnet reverts to a non-persistent or non-superconducting state.

SUMMARY OF THE INVENTION

The present invention relates to a support structure for high field strength electromagnets and consists of two or more non-ferrous rings disposed around and along the magnet bore axis for holding electromagnetic coils in compression. Each such non-ferrous ring is separated from the adjacent ring by a number of connecting struts oriented parallel to the magnet bore axis and spaced around the circumference of the rings.

It is one object of the invention to provide a readily manufactured, lightweight means of supporting coils of a high field magnet.

A further object of the invention is to reduce mutual inductance between the support structure and the magnet coils. The use of struts and the orientation of the struts parallel to the magnet axis reduces mutual inductance between the magnet coils and the supporting structure. Such mutual inductance is believed to interfere with smooth ramping of the magnet.

It is yet another object of the invention to provide a more flexible magnet support structure. Such structure is believed to improve magnet ramping by accommodating minor alignment errors or sudden changes in axial force. The use of low mass struts rather than a more massive support structure results in more axial flexibility in the magnet. This reduces the tendency of the coils to slip with respect to the support structure, such as may occur when the coils are subjected to momentary increases in current and hence increases in axial force, or when the coils are subjected to an uneven axial force as a result of minor alignment errors during assembly. Any such slipping of the coil with respect to its supports during ramping increases the possibility that the coil will quench.

It is a further object of the invention to permit the use of readily manufactured laminations to be used for the coil support rings. The use of connecting struts to position the rings with respect to each other facilitates the construction of the rings from a plurality of laminations, such laminations incorporating the required holes and indentations to receive the connecting struts and being appropriately sized to define a shoulder against which the magnet coil may seat.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

BRIEF DESCRIPTION OF THE DRAWINGS

FIG. 2 is a side elevation view of the magnet support structure shown with portion broken away;

FIG. 7 is an enlarged detail view of a lip portion of the end support ring;

FIG. 8 is an exploded perspective view of an alternate construction of a coil support ring for the magnet support structure; and FIG. 9 is a schematic representation of a three coil magnet support structure showing forces acting thereon and exaggerated deflections during operation.

DETAILED DESCRIPTION OF THE INVENTION

Figure 1:
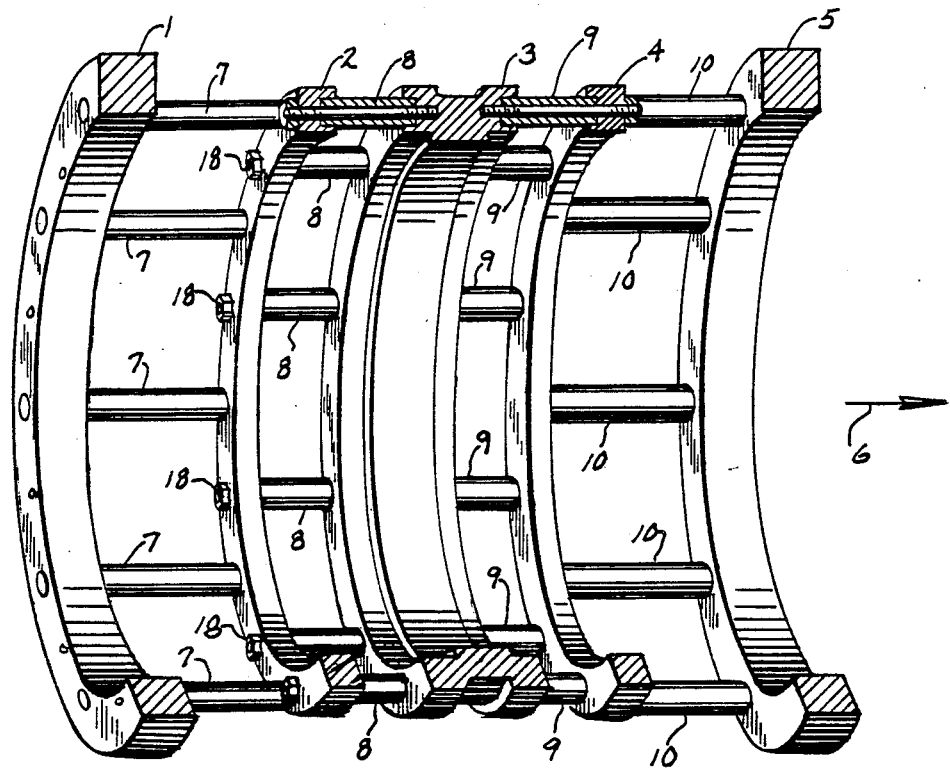
FIG. 1 is a cross-sectional, perspective view of a magnet support structure according to the present invention.
Figure 3:
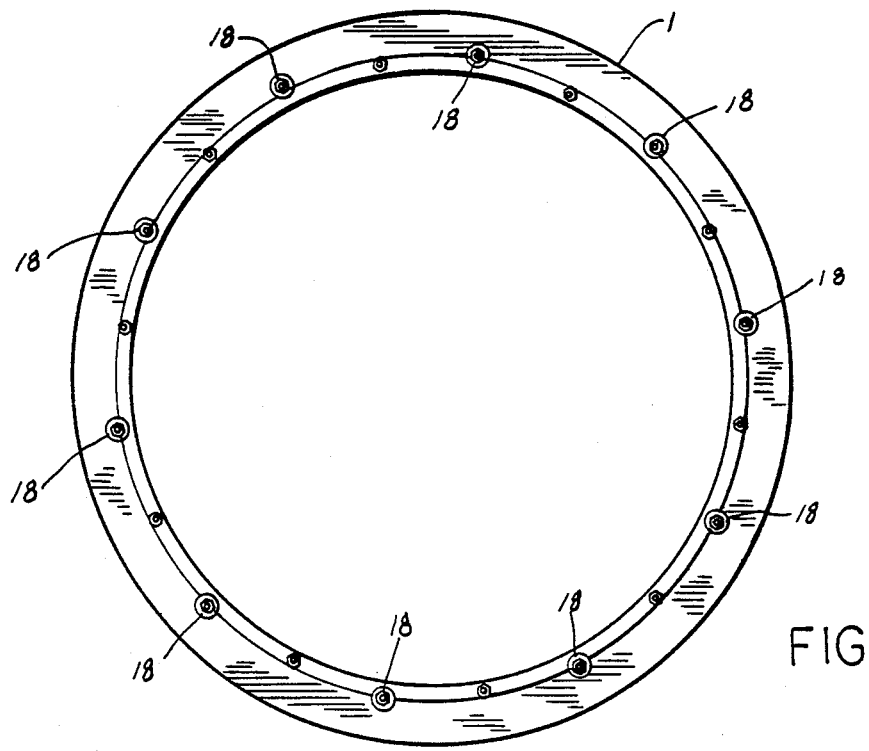
FIG. 3 is an end plan view of the magnet support structure.

Referring particularly to FIGS. 1 and 3, a magnet support structure according to the teachings of the present invention includes a set of magnet coil support rings 1-5 which are spaced apart along a central solenoid magnet bore axis 6 and are aligned concentrically therewith. The support rings 1-5 are separated apart and fastened together by sets of supporting struts 7-10. The struts in each set 7-10 are disposed around the central magnet bore axis 6 and extend in a direction parallel to the axis 6 to connect with the associated supporting rings 1-5 at their ends. The support structure is preferably made of non-magnetic materials. For example, the rings 1-5 and the struts 7-10 in the preferred embodiment are made of aluminum.

The magnet of the preferred embodiment is symmetric about the bore axis 6, and is also symmetric along the axis 6 about the central support ring 3. As a consequence, the support structure is also symmetric about the central support ring 3, with the struts 8, intermediate support ring 2, struts 7 and end support ring 1 being a mirror image of the respective struts 9, intermediate support ring 4, struts 10 and end support ring 5. The construction of rings 1-3 and their associated strut sets 7 and 8 will now be described in detail, however, the same description also applies to the symmetrical rings 3-5 and associated struts 9 and 10.

Figure 4:
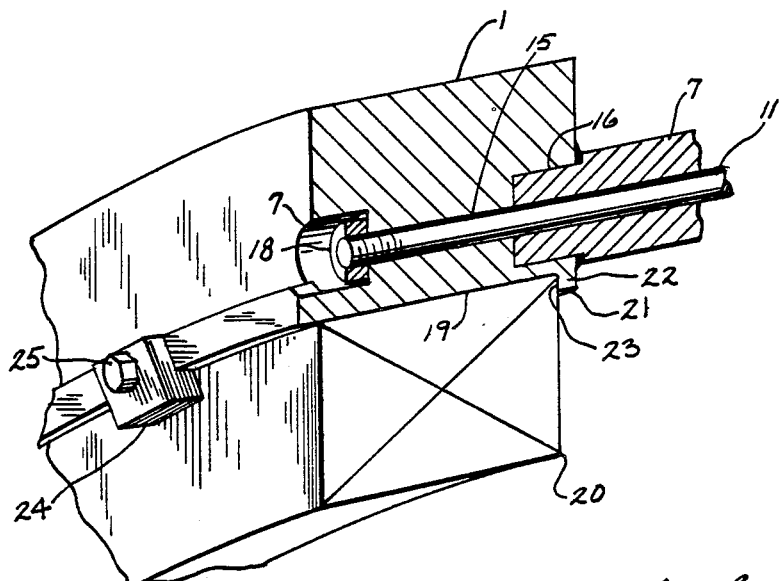
FIG. 4 is a cross-sectional perspective view of a portion of an end support ring for the magnet support structure and also shown with a magnet coil in position.

Referring to FIG. 4 there is shown a cross section taken through end ring 1 and one of the struts 7. A strut 7 is tubular and a threaded non-magnetic (e.g. brass) rod 11 extends through the strut 7. End ring 1 has a longitudinal throughbore 15 into and beyond which the rod 11 extends. A counterbore 17 is provided at the axially outer end of the through-bore 15 and a counterbore 16 is provided at the axially inner end of the through-bore 15. The end of strut 7 is received in a sliding fit in the counterbore 16 and a nut 18, which is screwed onto the rod 11, is housed in the counterbore 17. Prior to insertion, the end of strut 7 is coated with a low temperature epoxy which bonds the strut 7 to the end ring 1 to prevent loosening of the nut 18.

An electromagnetic coil 20 is received on the radially inside surface 19 of end ring 1. The diameter of the radial inside surface 19 is sized so that the magnet coil 20 may be readily inserted into end ring 1 when end ring 1 and magnet coil 20 are at room temperature. When magnet coil 20 and end ring 1 are cooled to superconducting temperatures, the high coefficient of expansion of the aluminum of end ring 1 compared to the coefficient of expansion of the epoxy and wire of magnet coil 20 causes magnet coil 20 to be held tightly in compression by end ring 1. The compressional stress generated by end ring 1 helps the coil 20 to resist high hoop stresses resulting from the internal self-repulsion of magnet coil 20 when energized. The compression of magnet coil 20 by end ring 1 also provides a tight friction fit to hold magnet coil 20 against axial movement as a result of magnetic forces between magnet ring 20 and adjacent coils in the magnet support structure. Further restraint against axial movement by magnet coil 20 is provided by the clamping means described below.

Radially inside surface 21 of end ring 1 forms a lip 22 (FIGS. 4 and 7) which extends radially inward around the entire inside circumference of ring 1 to define a shoulder or land 23 which faces axially outward. A set of clamps 24 are fastened to the axially outer face of the ring 1 by bolts 25 which are bolted to the ring 1. The clamps 24 are disposed around the circumference of the ring 1 to bear on and secure a magnet coil 20 against the land 23 when the clamps 24 are tightened against the magnet coil 20. The magnet coil 20 is thus securely fastened to the inner surface of the ring 1 and restrained further from moving in the axial direction. It is noted that the clamps 24 are primarily for holding the magnet coils when the coils are deenergized and also to position the coils before shrinking the rings around the coils. When the coils are energized, magnetic forces on the coils pull them in the axial direction toward one another and toward the radial central plane of the assembly so as to shorten the assembly or collapse it toward the middle. The position of the clamps described above corresponds to co-currents in the magnet coils, e.g., where the current in adjacent coils flows in the same direction, clockwise or counterclockwise around the bore. If the currents in adjacent coils may be counter to one another, as in the case of an actively shielded coil, the clamp and lip would have to be on the other face of the magnet.

Figure 5:
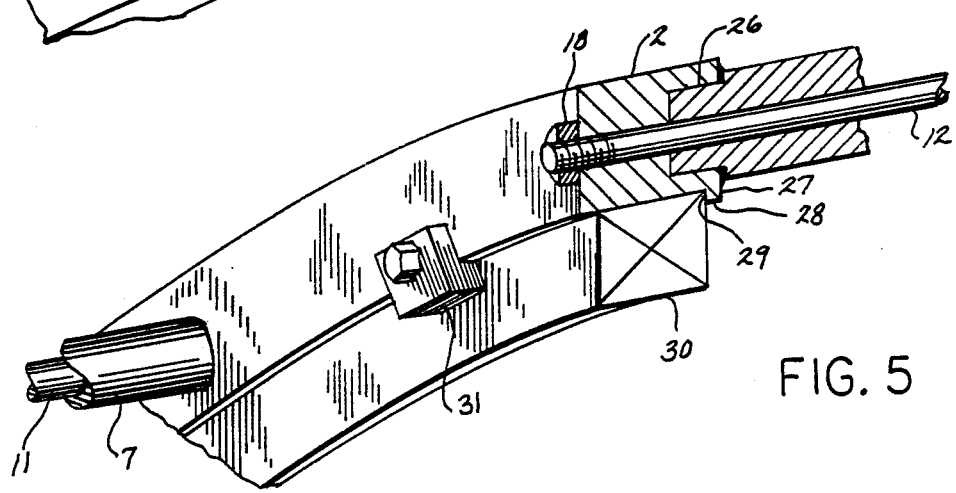
FIG. 5 is a cross-sectional perspective view of a portion of an intermediate support ring for the magnet support structure and also shown with a magnet coil in position.

As shown in FIG. 5, the construction of the intermediate magnet coil support ring 2 is virtually the same as that of ring described above. The struts 7 are bonded in counterbores in the axial outer face of ring 2 and are fastened with nuts 18 along the axially inner face of ring 2 (shown in FIG. 2). Similarly, tubular struts 8 are bonded in counterbores 26 formed around the circumference of the axial inside face 27 of the ring 2, and are attached to the ring 2 by threaded rods 12 which extend through the struts 8 and the ring 2 and are fastened with nuts 18 at the axially outer face of the ring 2. The nuts 18 are not recessed in counterbores because the nuts on ring 2 do not add to the length of the magnet which is desirably as short as possible. The ring 2 is cold shrunk around the coil 30 and the radially inside periphery 27 of ring 2 defines a lip 28 having an axially outward facing land 29 against which a magnet coil 30 is secured by clamps 31 in the manner previously described.

Figure 6:
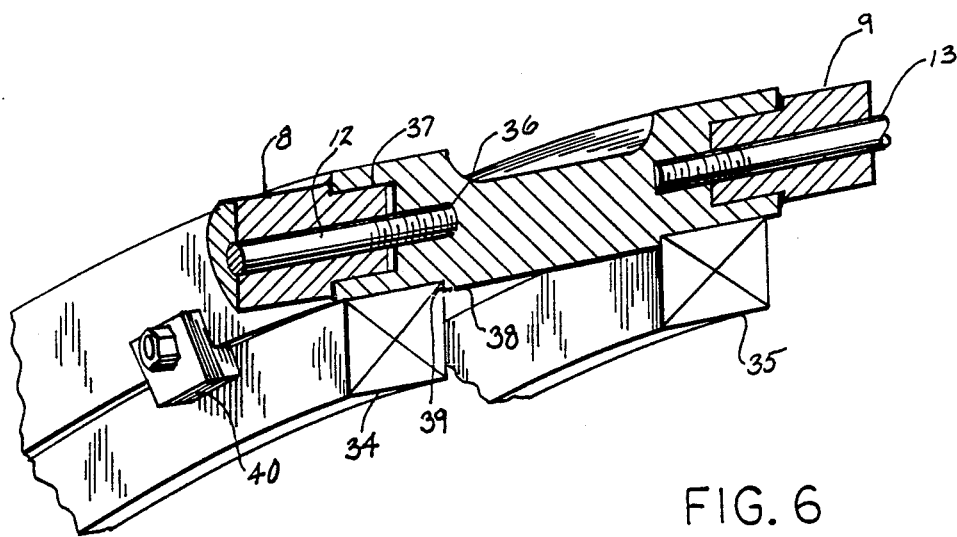
FIG. 6 is a cross-sectional perspective view of a portion of a center support ring for the magnet support structure and also shown with two magnet coils in position.

As shown in FIG. 6, the construction of ring 3 is substantially different from the rings 1 and 2, since it holds two magnet coils 34 and 35. The close proximity of these two coils 34 and 35 obviates the need for connecting struts and instead ring 3 is elongated in the axial direction to hold both coils 34 and 35. Struts 8 are affixed to ring 3 by means of a tapped, blind hole 36 with a counterbore 37. The end of strut 8 to be connected to ring 3 is painted with epoxy and fitted into counter bore 37 so that the epoxy bonds the strut to the rings. The corresponding end of the threaded rod 12 is threaded into tapped hole 36. Coil 34 is secured to the support ring 3 by a shrink fit as previously described and a radially inwardly extending lip 38 which defines an axially outwardly facing land 39. Clamps 40 also are used which bear on the outboard faces of the coil 34.

Each support ring 1-5, in the preferred embodiment, is formed and fitted by a shrink fitting process to the coils so as to constrain movement of the coils during operation of the magnet and to aid the coils in resisting hoop stresses at their rated currents as previously described and as is described in U.S. Pat. No. 4,467,303 which is hereby incorporated by reference.

In one embodiment described above, each ring 1-5 is machined from a solid casting or forging. In an alternate embodiment each such ring may be composed of a number of laminations having the correct sequence of holes and then fastened together by means of auxiliary bolts and nuts and the connecting struts and threaded rods. FIG. 8 shows this technique as applied to ring 1. Laminations 45-47 and 50-53 include oversized holes 55 which form the receiving counterbores for nuts 18 and struts 7. Laminations 48 and 49 have smaller holes 56 slightly larger than the outside dimension of threaded rod 11. End laminations 52 and 53 have a somewhat smaller inner radius to form lip 22 and land 23.

The struts 7-10 are spaced uniformly around the periphery of each ring 1-5 so as to share equally the compressive force resulting from the mutual attraction of each contained magnet coil. The struts are staggered to aid in assembly of the structure. Ten such struts separate each ring 1-5 in the preferred embodiment, however, the number of struts 7-10 may be varied if the individual strut strength is correspondingly varied. For a 1.5 Tesla magnet with a bore of approximately 50", the outermost rings 1 and 8 are separated by struts of approximate length 14" which must be 2.0" in diameter to accommodate a centerbored hole of 1.0" and provide adequate strength. Rings 2 and 4 are separated from ring 3 by struts of approximate length 9" but which maintain the same diameter despite their proportionally higher bending strength for reasons of manufacturing convenience. The particular dimensions of the magnet bore and the separation of the rings and the rings' diameter may be varied according to the desired characteristics of the magnetic field to be created. For any given magnet configuration the following is a description of the method for determining the acceptable strut strength, dimensions and number for the weakest strut set in accordance with the present invention.

The minimum size of the struts is governed by the elastic buckling limit for a set of columns represented by these struts. This buckling limit may be determined as follows. Referring to FIG. 9 there is shown a schematic view of a three-coil structure as seen along a line perpendicular to the magnet bore axis, z. In general, a multi-ring magnet may be decomposed into such three ring elements. In practice, the following equations are used to determine the required strength of the outermost struts 7 connecting rings 1, 2 and struts 10 connecting rings 4 and 5. These struts 7 and 10 are most prone to buckling both because of their high slenderness ratio and the high total compressive force between rings 1, 2 and rings 4, 5. The same number of struts and strut diameter may be used for struts 8, 9 between rings 2, 3 and rings 3, 4. The lower slenderness ratio of struts 8 and 9 insures that these struts have ample resistance to buckling.

The three rings 60-62 shown in FIG. 9 are separated and supported by struts 63 and struts 64. The rings are subject to a compressive force P and a transverse force Q resulting from a magnetic interaction between the coils contained by rings 60-62. L represents the distance between each supporting ring and y represents the deflection resulting from the compressive force P and the transverse force Q. As a result of this deflection, the magnetic field $B_o$ is curved within the bore of the magnet. The radius of that curvature is denoted R.

The buckling limit for the generalized structure shown in FIG. 3 is given by the following variation of Euler's elastic buckling equation for pivoted struts under normal load:

$$NEI \frac{d^2y}{dz^2} + Py + QyL = 0 \tag{1}$$

where:
  y = transverse displacement of the center ring
  L = distance between rings,
  P = axial buckling force,
  Q = transverse force on the central ring due to unit displacement of the central ring in the transverse direction,
  N = number of struts between two rings,
  z = axial distance
  I = moment of inertia for the struts,
  E = modulus of elasticity for the strut material,
Solving this differential equation yields the following formula which provides guidance as to the rigidity and minimum number of struts necessary to resist buckling.

$$\frac{P + QL}{NEI} = \frac{\pi^2}{4L^2} \tag{2}$$

The transverse force Q may be estimated as follows: When the central ring is displaced by an amount y, the curvature of the field lines is given by:

$$(2R - y)y = L^2 \, ; \, R \sim \frac{L^2}{2y} \tag{3}$$

The gradient of the field is then given by the expression:

$$\nabla B \sim \frac{-2B}{R} = \frac{-2B}{L^2} \cdot 2y = \frac{-4By}{L^2} \tag{4}$$

Where:
  B = the nominal axial magnetic field strength. The transverse force on the center ring due to this gradient is given by:

$$F = \mu \nabla B \tag{5}$$

Where:

$\mu$ = the magnetic moment of the coil
  = $N_t I \pi a^2$

Where:
  $N_t I$ = ampere turns of the magnet coil,
  a = average radius of the magnet coil, and
  B = the nominal magnet field strength. Therefore:

$$Q \sim \frac{-4BY}{L^2} N_t I \pi a^2 \tag{6}$$

The term QyL, in equation 1 and 2 is not present in a typical column under a constant load, such as an architectural column, but is the result of the magnetic interaction of the coils. As should be noted, this term may increase as the deflection y increases, depending on the orientation of the magnet coils, creating a potential instability or non-linear "kink" mode.

The above described procedure is used to determine the number, material and dimension of strut sets 7 and 10 which are the longest struts and under the most compression and hence most susceptible to buckling. As mentioned above, the same number, material and diameter of struts is used for strut sets 8 and 9, for reasons of manufacturing convenience. Accordingly, struts 8 and 9 are insured of being even more resistant to buckling than strut sets 7 and 10. This makes the center portion of the support structure from ring 2 to ring 4 more rigid than the end portions. Within the center portion, the ring 3, being made unitary, is stiffer than the portion between the ring 3 and the rings 2 and 4. Thus, the support structure becomes progressively more rigid toward the axial center.

It should be understood the minimum strut strength indicated by Equation 1 may be increased to provide an acceptable margin of safety. It should be noted that equation 1 assumes that the struts are free to pivot while in fact they are seated and bonded in counterbores in the supporting rings. Moreover, the threaded rods preload each strut affording the struts a somewhat higher resistance to transverse bending forces than is assumed under these formulas.

A magnet support frame of the invention has now been fully described. This construction can be readily manufactured from common materials. Each ring 1-5 may be cast separately in a much smaller mold than required if all the rings were unitary. Subsequent machining operations are also easier because of the relatively convenient size of each ring. Moreover, even after the rings are produced, latitude and modifications in the design of the magnet is provided for simply by changing the length of the sets of struts. Moreover, the open design of the support structure has the additional advantage of making it relatively easy to mount ancillary devices which may be included with the products, such as switches, heaters, resistors and other equipment. The second embodiment disclosed, having laminated support rings, lends itself to further manufacturing efficiencies (e.g. a stamping process may be employed).

In ramping and operation of the superconducting magnet, the construction of a support structure of the invention also reduces the mutual inductance between the magnet coils and the supporting structure. The open construction of the support structure reduces the possible eddy current paths through the support structure to minimize any interference with ramping otherwise caused by such eddy currents and resulting mutual inductance.

The invention also provides a more flexible magnet support structure. Magnets made using a support structure of the invention have been found to ramp smoothly. It is believed that this is at least partly due to the fact that the support structure is somewhat less rigid than prior designs and allows for some flexure and small movements to accommodate and correct for any misalignments of the magnet coils. Thus, although the frame is rigid, some self adjustment is inherent in the construction of a support structure of the invention. Many modifications and variations of the preferred embodiment which will still be within the spirit and scope of the invention will be apparent to those of ordinary skill in the art. For example, although the central ring 3 of the preferred embodiment is shown as a unitary part, it could be made as two separate rings spaced apart by suitable struts. Another example is that a support structure of the invention could be adapted to any number of magnet coils. Thus, the invention is not limited to the preferred embodiment but is defined by the claims which follow.

We claim:

1. A magnet support structure for a set of magnet coils of a solenoid magnet comprising:

a set of at least two magnet support rings spaced apart along the length of a magnet bore axis of the solenoid magnet, each ring being disposed coaxially with the bore axis of the solenoid magnet;

means for mounting at least one magnet coil of said set in each of said magnet support rings with said coil coaxial with the magnet bore axis;

a set of at least three struts extending between and rigidly connecting successive magnet support rings, each strut being parallel to the magnet bore axis and disposed around the magnet bore axis, said struts being sized and positioned to resist axial forces to which said spaced magnet support rings are subjected as a result of the magnetic forces produced by the set of magnet coils;

wherein the means for mounting the magnet coil to a magnet support ring includes:

a radially inward extending lip formed around the inner surface of the magnet support ring, said lip defining a land to bear the axial force of the coil; and clamping means mounted around the circumference of the magnet support ring opposite from the land to sandwich the magnet coil between the land and the clamping means to restrain the magnet coil against movement along the magnet bore axis.

2. A magnet support structure for a set of magnet coils of a solenoid magnet comprising:

a set of at least two magnet support rings spaced apart along the length of a magnet bore axis of the solenoid magnet, each ring being disposed coaxially with the bore axis of the solenoid magnet;

means for mounting at least one magnet coil of said set in each of said magnet support rings with said coil coaxial with the magnet bore axis;

a set of at least three struts extending between and rigidly connecting successive magnet support rings, each strut being parallel to the magnet bore axis and disposed around the magnet bore axis, said struts being sized and positioned to resist axial forces to which said spaced magnet support rings are subjected as a result of the magnetic forces produced by the set of magnet coils;

wherein the struts are tubular and connecting rods extend through the struts to hold the rings together and preload the struts in compression.

3. A magnet support structure for a set of magnet coils of a solenoid magnet comprising:

a set of at least two magnet support rings spaced apart along the length of a magnet bore axis of the solenoid magnet, each ring being disposed coaxially with the bore axis of the solenoid magnet;

means for mounting at least one magnet coil of said set in each of said magnet support rings with said coil coaxial with the magnet bore axis;

a set of at least three struts extending between and rigidly connecting successive magnet support rings, each strut being parallel to the magnet bore axis and disposed around the magnet bore axis, said struts being sized and positioned to resist axial forces to which said spaced magnet support rings are subjected as a result of the magnetic forces produced by the set of magnet coils and wherein the struts are orientated with respect to the axial faces of the magnet support rings by bores in the magnet support rings.

4. A magnet support structure as in claim 1, having at least three magnet support rings separated by two or more sets of struts, where each set of struts is staggered circumferentially with respect to the set of struts separating the adjacent rings.

5. A magnet support structure as in claim 1, having at least three magnet support rings, said structure becoming axially more rigid toward the center of the structure.

6. A support structure as in claim 1, having at least three support rings and wherein the struts are chosen according to the formula:

$$\frac{P + QL}{NEI} = \frac{p2}{4L^2}$$

where $$Q \sim \frac{-4BY}{L^2} N_t I p\, a^2$$

and
y = transverse displacement of the center ring from the field axis
L = distance between rings,
P = axial buckling force,
Q = transverse force on the central ring due to unit displacement of the central ring in the transverse direction,
N = number of tie bars between two rings
I = moment of inertia for the tie bars,
E = modulus of elasticity for the tie bar material,
$N_t I$ = ampere turns of the coil,
a = average radius of the coil, and
B = the nominal field strength.

7. A magnet support structure for a set of magnet coils of a solenoid magnet comprising:
a set of at least two magnet support rings spaced apart along the length of a magnet bore axis of the solenoid magnet, each ring being disposed coaxially with the bore axis of the solenoid magnet;
means for mounting at least ne magnet coil of said set in each of said magnet support rings with said coil coaxial with the magnet bore axis;
a set of at least three struts extending between and rigidly connecting successive magnet support rings, each strut being parallel to the magnet bore axis and disposed around the magnet bore axis, said struts being sized and positioned to resist axial forces to which said spaced magnet support rings are subjected as a result of the magnetic forces produced by the set of magnet coils; and
wherein the magnet support rings are made from laminated sheets.

8. A magnet support structure as in claim 2, having at least three magnet support rings separated by two or more sets of struts, where each set of struts is staggered circumferentially with respect to the set of struts separating the adjacent rings.

9. A magnet support structure as in claim 2, having at least three magnet support rings, said structure becoming more rigid toward the axial center of the structure.

10. A support structure as in claim 2, having at least three support rings and wherein the struts are chosen according to the formula:

$$\frac{P + QL}{NEI} = \frac{p2}{4L^2}$$

where $$Q \sim \frac{-4BY}{L^2} N_t I p\, a^2$$

and
y = transverse displacement of the center ring from the field axis
L = distance between rings,
P = axial buckling force,
Q = transverse force on the central ring due to unit displacement of the central ring in the transverse direction,
N = number of tie bars between two rings
I = moment of inertia for the tie bars,
E = modulus of elasticity for the tie bar material,
$N_t I$ = ampere turns of the coil,
a = average radius of the coil, and
B = the nominal field strength.

11. A magnet support structure as in claim 3, having at least three magnet support rings separated by two or more sets of struts, where each set of struts is staggered circumferentially with respect to the set of struts separating the adjacent rings.

12. A magnet support structure as in claim 3, having at least three magnet support rings, said structure becoming more rigid toward the axial center of the structure.

13. A support structure as in claim 3, having at least three support rings and wherein the struts are chosen according to the formula:

$$\frac{P + QL}{NEI} = \frac{p2}{4L^2}$$

where $$Q \sim \frac{-4BY}{L^2} N_t I p\, a^2$$

and
y = transverse displacement of the center ring from the field axis
L = distance between rings,
P = axial buckling force,
Q = transverse force on the central ring due to unit displacement of the central ring in the transverse direction,
N = number of tie bars between two rings
I = moment of inertia for the tie bars,
E = modulus of elasticity for the tie bar material,
$N_t I$ = ampere turns of the coil,
a = average radius of the coil, and
B = the nominal field strength.

14. A magnet support structure as in claim 7, having at least three magnet support rings separated by two or more sets of struts, where each set of struts is staggered circumferentially with respect to the set of struts separating the adjacent rings.

15. A magnet support structure as in claim 7, having at least three magnet support rings, said structure becoming more rigid toward the axial center of the structure.

16. A supportstructure as in claim 7, having at least three support rings and wherein the struts are chosen according to the formula:

$$\frac{P + QL}{NEI} = \frac{p2}{4L^2}$$

where $$Q \sim \frac{-4BY}{L^2} N_t I p a^2$$

and y = transverse displacement of the center ring from the field axis
L = distance between rings,
P = axial buckling force,
Q = transverse force on the central ring due to unit displacement of the central ring in the transverse direction,
N = number of tie bars between two rings
I = moment of inertia for the tie bars,
E = modulus of elasticity for the tie bar material,
$N_t I$ = ampere turns of the coil,
a = average radius of the coil, and
B = the nominal field strength.

* * * * *

UNITED STATES PATENT AND TRADEMARK OFFICE
CERTIFICATE OF CORRECTION

PATENT NO. : 4,896,128
DATED : January 23, 1990
INVENTOR(S) : Wollan, et al.

It is certified that error appears in the above—identified patent and that said Letters Patent is hereby corrected as shown below:

Col. 1, line 10    Delete the period at beginning of line.

Col. 1, line 50    Delete the number "10"

Col. 4, line 32    "of ring" should be --of ring 1--.

Col. 9, line 50    "ne" should be --one--.

Col. 11, line 10    "supportstructure" should be --support structure--.

Signed and Sealed this

First Day of January, 1991

Attest:

HARRY F. MANBECK, JR.

*Attesting Officer*      *Commissioner of Patents and Trademarks*